United States Patent [19]

Lee

[11] Patent Number: 6,074,923
[45] Date of Patent: Jun. 13, 2000

[54] METHOD OF FABRICATING METAL-OXIDE-SEMICONDUCTOR TRANSISTOR

[75] Inventor: Tzung-Han Lee, Taipei, Taiwan

[73] Assignee: United Microelectronics Corp., Hsinchu, Taiwan

[21] Appl. No.: 09/107,583

[22] Filed: Jun. 9, 1998

[30] Foreign Application Priority Data

Apr. 27, 1998 [TW] Taiwan ................................. 87106431

[51] Int. Cl.[7] .......................... H01L 21/336; H01L 21/44
[52] U.S. Cl. .......................... 438/305; 438/301; 438/303; 438/583; 438/683; 438/687; 438/688
[58] Field of Search .................................. 438/301, 303, 438/305, 583, 683, 687, 688

[56] References Cited

U.S. PATENT DOCUMENTS 5,950,090  9/1999  Chen et al. .............................. 438/296
5,981,365  11/1999  Cheek et al. ............................ 438/592
5,994,192  11/1999  Chen ...................................... 438/303

Primary Examiner—John F. Niebling
Assistant Examiner—Alexander G. Ghyka

[57] ABSTRACT

A method of manufacturing a MOS transistor begins with the provision of a semiconductor substrate. A gate oxide layer, a polysilicon layer and a silicon nitride layer are sequentially formed over the substrate. Next, the gate oxide layer, the polysilicon layer and the silicon nitride layer are patterned to form a gate structure. Subsequently, spacers are formed covering the sidewalls of the gate oxide layer, the polysilicon layer and the silicon nitride layer. Thereafter, a dielectric layer is formed, and covers the semiconductor substrate, the silicon nitride layer and the spacers. Next, a planarization operation is carried out to remove a portion of the dielectric layer. Planarization continues until the silicon nitride layer is exposed. After that, the silicon nitride layer is removed, exposing the polysilicon layer, and then a glue layer is formed over the dielectric layer and the polysilicon layer. Finally, a conductive layer is formed over the glue layer to complete the fabrication of the MOS transistor.

12 Claims, 5 Drawing Sheets

METHOD OF FABRICATING METAL-OXIDE-SEMICONDUCTOR TRANSISTOR

CROSS-REFERENCE TO RELATED APPLICATION

This application claims the priority benefit of Taiwan application serial no. 87106431, filed Apr. 27, 1998, the full disclosure of which is incorporated herein by reference.

BACKGROUND OF THE INVENTION

1. Field of Invention

The present invention relates to a method of fabricating a metal-oxide-semiconductor (MOS) transistor. More particularly, the present invention relates to a method of fabricating a MOS transistor capable of increasing pad area size as well as improving alignment accuracy in subsequent processes.

2. Description of Related Art

A MOS transistor is a basic device in an integrated circuit. A MOS transistor unit comprises a gate structure, a source region and a drain region, wherein the gate structure includes a metallic layer and an oxide layer. In general, the metallic layer is made from a material having properties very close to silicon such as polysilicon, and the oxide layer is made from silicon dioxide ($SiO_2$). The source/drain regions are formed in a substrate on either side of the gate structure.

Conventionally, the metallic layer is a composite layer made from a doped polysilicon layer and a tungsten silicide layer. Polysilicon is used because it adheres well to the oxide layer. However, to increase a transistor device's data transmission speed, it is customary to deposit a highly conductive layer over the doped polysilicon layer. In addition, a highly conductive layer is also deposited on the surface above the source/drain regions. Preferably, the highly conductive layer is a tungsten silicide layer. Nevertheless, as devices are miniaturized, correctly aligning the layer of conductive material to the designated device region becomes more difficult. Furthermore, the deposition of a conductive layer over a polysilicon layer has to be carried out separately from the deposition of a conductive layer over the source/drain regions.

FIGS. 1A through 1F are cross-sectional views showing the progression of manufacturing steps taken to fabricate a MOS transistor according to a conventional method.

First, as shown in FIG. 1A, a semiconductor substrate 10 is provided. Next, a photoresist layer and a photomask are used to define devices' active areas. Thereafter, devices are isolated from each other by forming device isolation structures. For example, shallow trench isolation (STI) structures 12 are formed.

Next, as shown in FIG. 1B, a silicon dioxide layer having a thickness of about 100–250 Å is formed over the entire substrate 10 using, for example, a thermal oxidation method. The silicon dioxide layer functions as a gate oxide layer 14 for the MOS transistor. Thereafter, a polysilicon layer 16 having a thickness of about 2000–3000 Å is deposited over the gate oxide layer 14 using, for example, a low-pressure chemical vapor deposition (LPCVD) method. Subsequently, highly concentrated phosphorus or arsenic ions are doped into the polysilicon layer 16 using either a heat diffusion method or an ion implantation method. Consequently, resistivity of the polysilicon layer 16 is greatly lowered. Later, a photoresist layer 20 is formed over the polysilicon layer 16 and then patterned to form a mask for defining the gate structure.

Next, as shown in FIG. 1C, the doped polysilicon layer 16 and the gate oxide layer 14 are etched to form a polysilicon layer 16a and gate oxide layer 14a by using the photoresist layer 20 as a mask. Together, the polysilicon layer 16a and the gate oxide layer 14a form the gate structure of the MOS transistor. Thereafter, the photoresist layer 20 is removed using, for example, sulfuric acid ($H_2SO_4$).

Next, as shown in FIG. 1D, using the polysilicon layer 16a as a mask, the substrate 10 is doped to form lightly doped source/drain regions by implanting phosphorus ions, for example. Concentration level of the implanted ions is about $10^{13}/cm^2$, which is low.

Next, as shown in FIG. 1E, a dielectric layer is formed over the entire substrate structure. The dielectric layer is, for example, a silicon dioxide layer, a silicon nitride layer or other layers having properties similar to the two above. Thereafter, a portion of the dielectric layer is removed to expose a large portion of the source/drain region, and forming spacers 24 on the sidewalls of the polysilicon layer 16a and gate oxide layer 14a. The dielectric layer is removed by, for example, an anisotropic dry etching method. In the subsequent step, using the polysilicon layer 16a and the spacers 24 as masks, the substrate 10 is doped to form heavily doped source/drain regions 18a by implanting phosphorus or arsenic ions, for example. Concentration level of this second implant is higher than the first light implantation, roughly about $10^{15}/cm^2$, and implantation depth is also much deeper.

Next, as shown in FIG. 1F, a dielectric layer 26 is formed over the entire substrate structure. The dielectric layer is made from silicon dioxide, for example. Then, the dielectric layer 26 is patterned to form an opening 30 that exposes a portion of the polysilicon layer 16a. Thereafter, a conductive layer 32 such as tungsten is deposited over the dielectric layer 26 and completely fills the opening 30 so that electrical connection with the polysilicon layer 16a is achieved. Subsequently, the conductive layer 32 is patterned to form local interconnect or a pad.

Finally, subsequent processing operations are carried out to complete the fabrication of the MOS transistor. Since these processes are not directly related to this invention, details are omitted here.

However, as the level of integration continue to increase, dimensions of a semiconductor device shrink correspondingly. Therefore, when the conductive layer is formed, it is difficult to correctly align the conductive layer to the target region. In the process of patterning the dielectric layer 26, if there is a shift in the location of the opening 30, subsequently deposited conductive layer 32 will be out of alignment with the opening 30. Therefore, the required electrical connection between the conductive layer 32 and the polysilicon layer 16a will not established, which leads to circuit failure.

In light of the foregoing, there is a need to provide a better method of fabricating a MOS transistor.

SUMMARY OF THE INVENTION

Accordingly, the present invention is to provide a method of manufacturing MOS transistor that directly deposits a conductive layer over a polysilicon layer first, thereby forming an electrical connection with the polysilicon layer. Hence, alignment problems caused by the deposition of conductive layer are prevented.

In another aspect, this invention provides a method of manufacturing a MOS transistor capable of patterning a conductive layer and forming an area with a size that reflects the actual processing requirement. In this manner, pad area can be increased to attain the alignment percentage needed in subsequent processing operation so that misalignment due to an increased level of integration is minimized.

To achieve these and other advantages and in accordance with the purpose of the invention, as embodied and broadly described herein, the invention provides a method of manufacturing a MOS transistor. The method comprises the steps of first providing a semiconductor substrate, and then sequentially forming a gate oxide layer, a polysilicon layer and a silicon nitride layer over the substrate. Next, the gate oxide layer, the polysilicon layer and the silicon nitride layer are patterned to form a gate structure. Subsequently, spacers are formed covering the sidewalls of the gate oxide layer, the polysilicon layer and the silicon nitride layer. Thereafter, a dielectric layer is formed covering the semiconductor substrate, the silicon nitride layer and the spacers. Next, a planarization operation is carried out to remove a portion of the dielectric layer until the silicon nitride layer is exposed. After that, the silicon nitride layer is removed, exposing the polysilicon layer, and then a glue layer is formed over the dielectric layer and the polysilicon layer. Finally, a conductive layer is formed over the glue layer to complete fabrication of the MOS transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
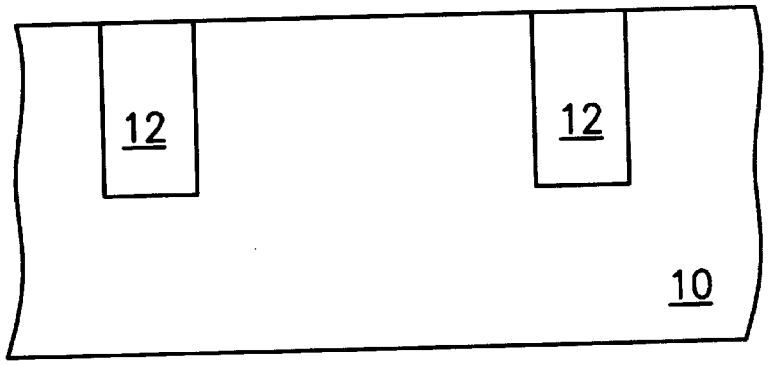
FIGS. 1A through 1F are cross-sectional views showing the progression of manufacturing steps taken to fabricate a MOS transistor according to a conventional method.
Figure 1B:
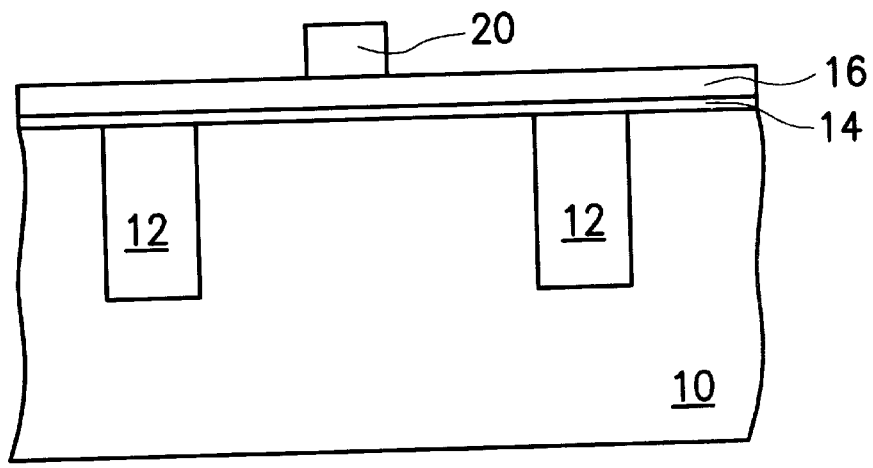
Figure 1C:
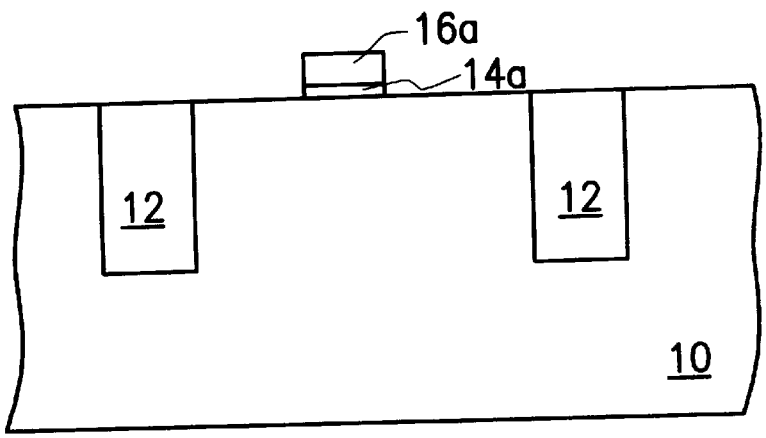
Figure 1D:
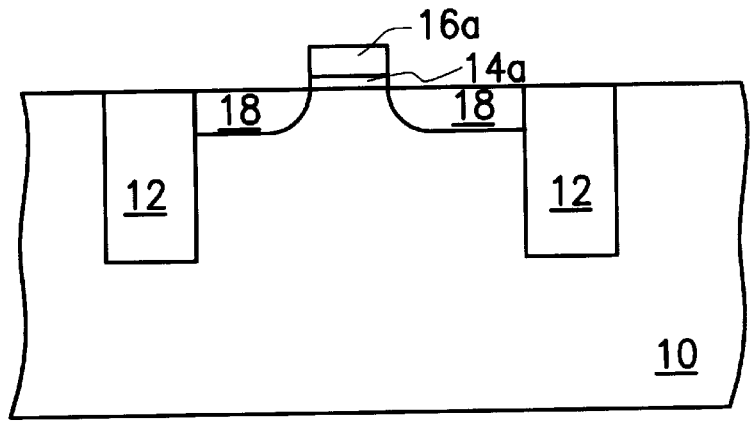
Figure 1E:
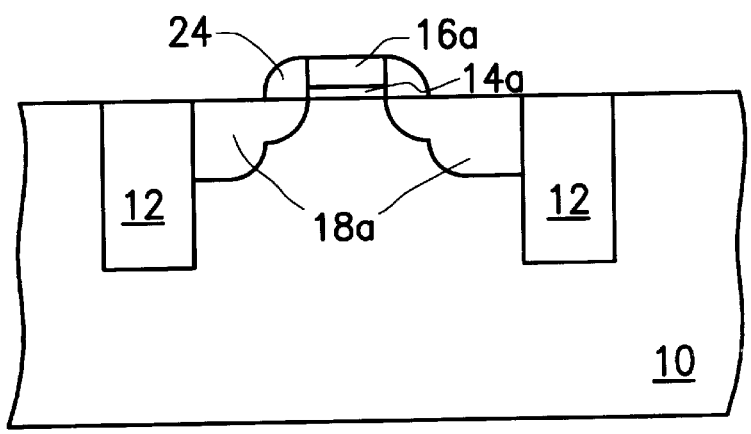
Figure 1F:
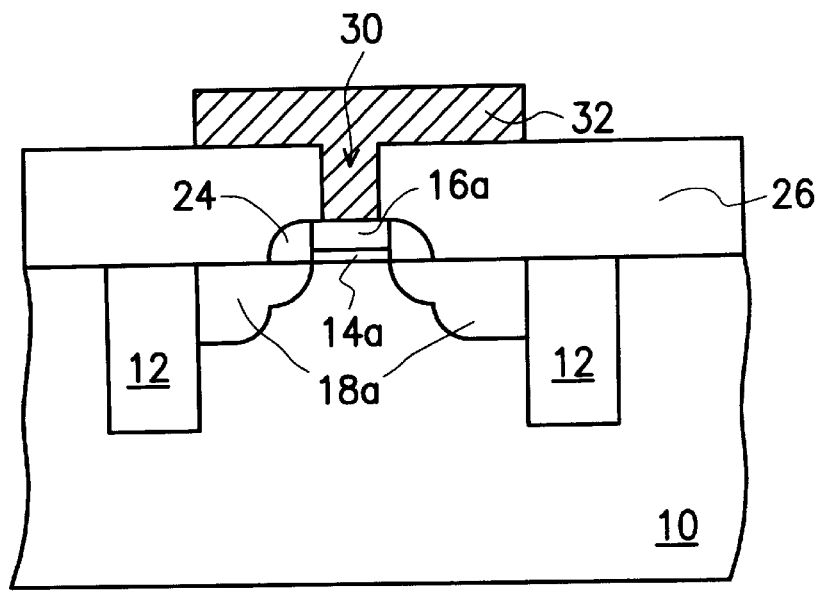

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2G are cross-sectional views showing the progression of manufacturing steps taken to fabricate a MOS transistor according to one preferred embodiment of this invention.

Figure 2A:
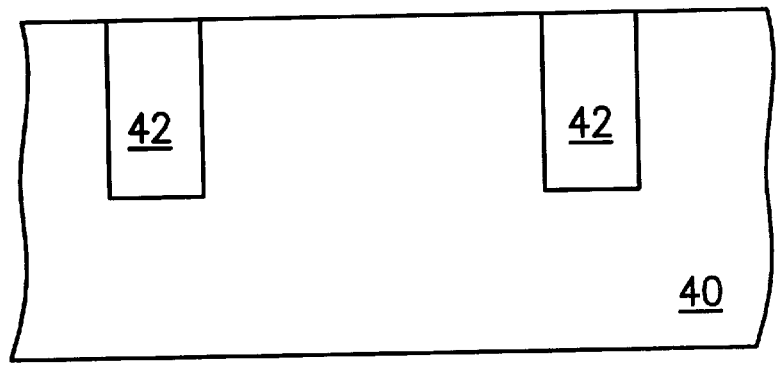
FIGS. 2A through 2G are cross-sectional views showing the progression of manufacturing steps taken to fabricate a MOS transistor according to one preferred embodiment of this invention.

First, as shown in FIG. 2A, a semiconductor substrate 40 is provided. Next, photoresist layer and photomask are used to define the devices' active regions. Thereafter, devices are isolated from each other by forming device isolation structures. For example, shallow trench isolation (STI) structures 42 are formed.

Figure 2B:
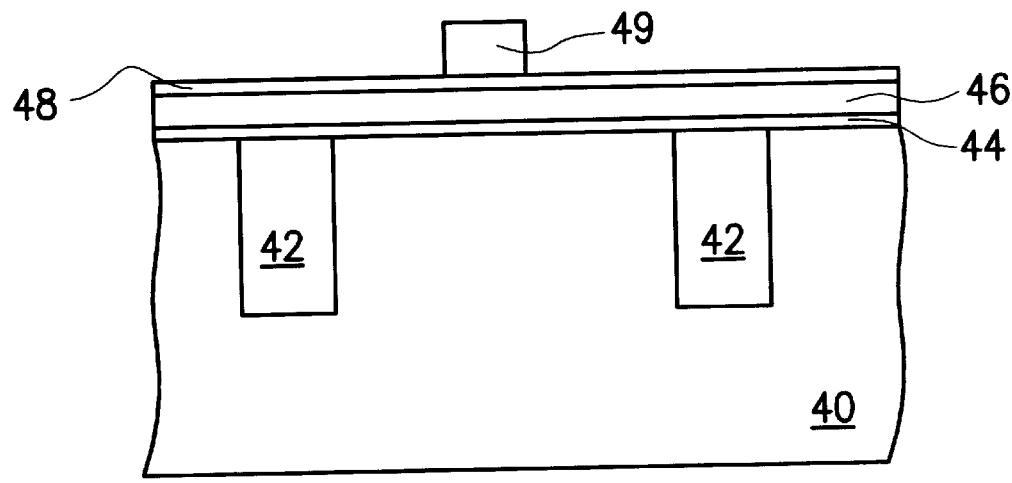

Next, as shown in FIG. 2B, a silicon dioxide layer having a thickness of about 100–250 Å is formed over the entire substrate 40 using, for example, a thermal oxidation method. The silicon dioxide layer functions as a gate oxide layer 44 for the MOS transistor. Thereafter, a polysilicon layer 46 having a thickness of about 2000–3000 Å is deposited over the gate oxide layer 44 using, for example, a low-pressure chemical vapor deposition (LPCVD) method. Subsequently, a silicon nitride layer 48 is deposited over the polysilicon layer 46. Then, a photoresist layer 49 is formed over the silicon nitride layer 48 and patterned to form a mask for defining the gate structure.

Figure 2C:
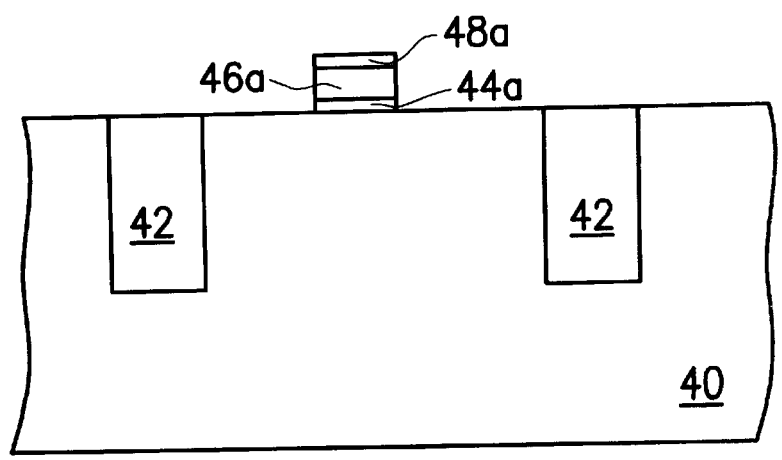

Next, as shown in FIG. 2C, using photolithographic and etching methods, the silicon nitride layer 48, the polysilicon layer 46 and the gate oxide layer 44 are etched to form a silicon nitride layer 48a, a polysilicon layer 46a and a gate oxide layer 44a. The photoresist layer 49 is used as a mask, in this process. The silicon nitride layer 48a, the polysilicon layer 46a and the gate oxide layer 44a together form the gate structure of the MOS transistor. Thereafter, the photoresist layer 49 is removed.

Figure 2D:
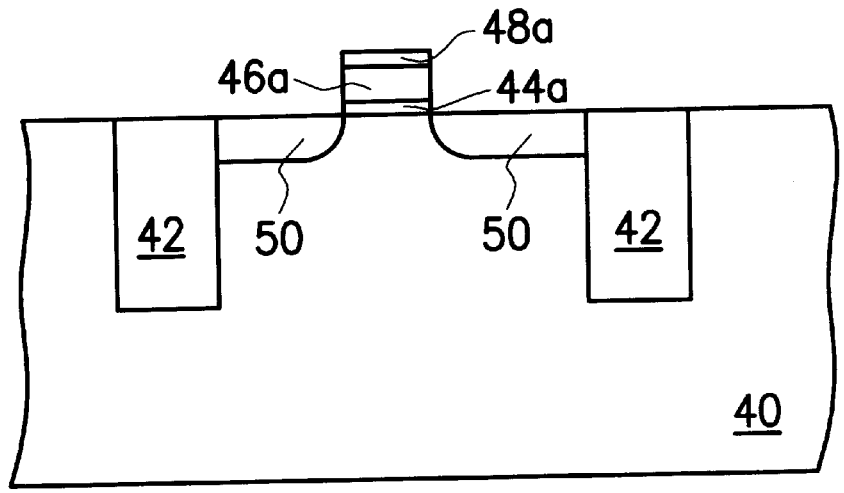

Next, as shown in FIG. 2D, using the silicon nitride layer 48a as a mask, the substrate 40 is doped to form lightly doped source/drain regions 50 by implanting, for example, phosphorus ions. Concentration level of the implanted ions is about $10^{13}/cm^2$, which is low.

Figure 2E:
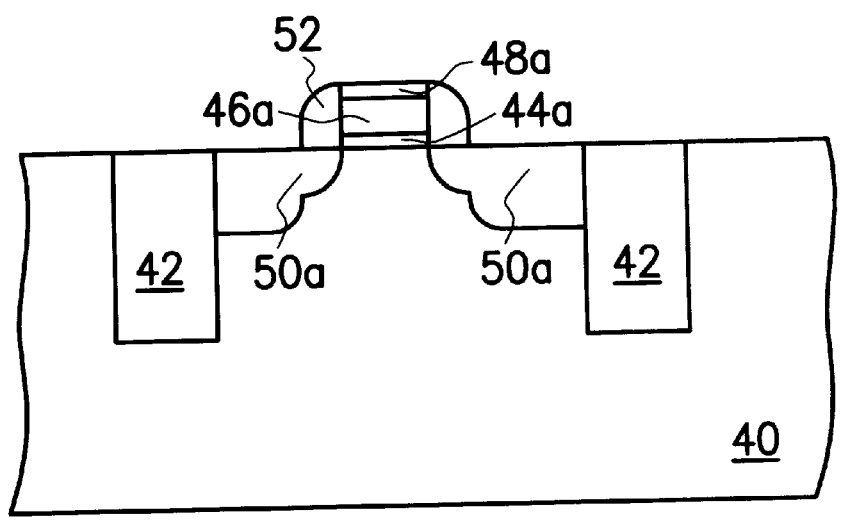

Next, as shown in FIG. 2E, a layer of dielectric is formed over the entire substrate structure. The dielectric layer is, for example, a silicon dioxide layer, a silicon nitride layer or other layers having properties similar to the two above. Thereafter, a portion of the dielectric layer is removed to expose a large portion of the source/drain regions, and form spacers 52 on the sidewalls of silicon nitride layer 48a, the polysilicon layer 46a and the gate oxide layer 44a. The dielectric layer is removed using, for example, an anisotropic dry etching method. In the subsequent step, using the silicon nitride layer 48a and the spacers 52 as masks, the substrate 40 is doped to form heavily doped source/drain regions 50a by implanting, for example, phosphorus or arsenic ions. Concentration level of this second implant is higher than the first light implantation, roughly about $10^{15}/cm^2$, and depth of implantation is also much deeper.

Figure 2F:
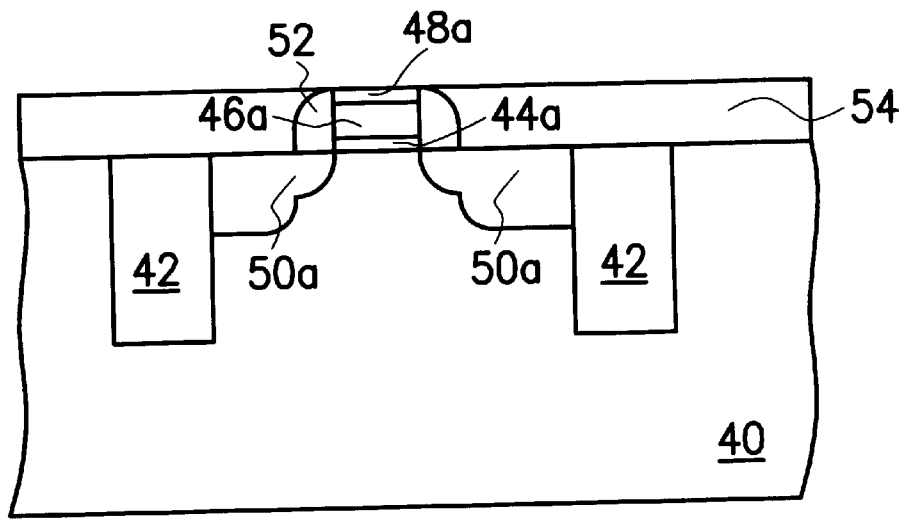

Next, as shown in FIG. 2F, a dielectric layer 54 is formed over the entire substrate structure, wherein the dielectric layer 54 is made from silicon dioxide, for example. Thereafter, a portion of the dielectric layer 54 is removed to expose the silicon nitride layer 48a using a chemical-mechanical polishing (CMP) method, for example.

Figure 2G:
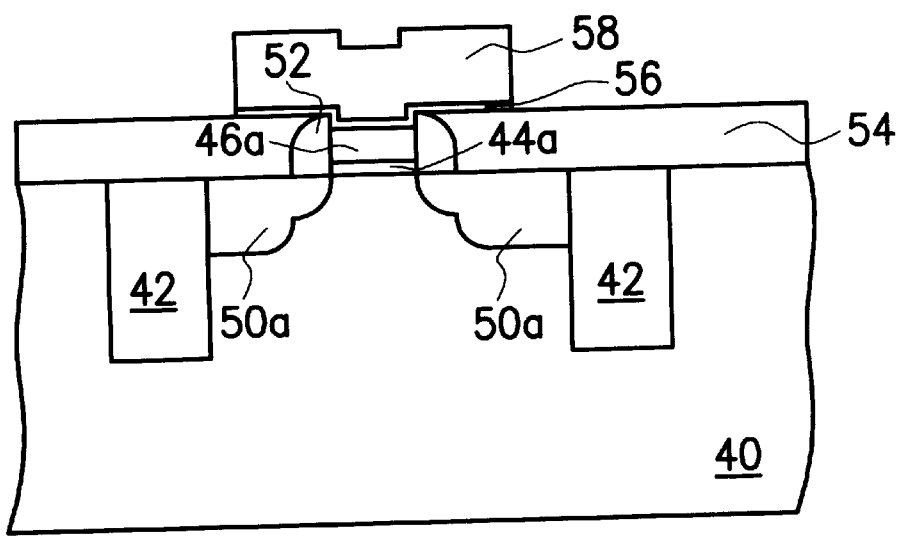

Next, as shown in FIG. 2G, an etching back method is used to remove the silicon nitride layer 48a and expose the polysilicon layer 46a. Then, ions are implanted into the polysilicon layer 46a to lower its resistance. Thereafter, a glue layer 56 is formed over the entire substrate structure, wherein the glue layer 56 is a titanium nitride (TiN) layer, for example. Subsequently, a conducting layer 58 is deposited over the glue layer 56 so that electrical connection is made with the polysilicon layer 46a. The conducting layer 58 is made from a material that includes tungsten (W), copper (Cu), silicon-aluminum alloy, tungsten silicide, or titanium silicide using a chemical vapor deposition method, for example. Then, conventional photolithographic and etching methods are used to pattern the conductive layer 58 and the glue layer 56 so that the patterned layers can be used as a local interconnect or pad in subsequent operations.

Finally, subsequent processing operations are carried out to complete the fabrication of the MOS transistor. Since these processes are not directly related to this invention, their details are omitted here.

In summary, the method of manufacturing MOS transistor according to this invention utilizes the deposition of a conductive layer over a polysilicon layer first, thereby forming electrical connection with the polysilicon layer. Hence, alignment errors made during the deposition of the conductive layer are greatly reduced.

Furthermore, when the conductive layer is patterned, the size of the patterned area is tailored to reflect the actual processing requirement. Hence, pad area is increased to attain whatever alignment percentage is needed in subsequent processing operations so that misalignment due to an increase in the level of integration is minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal-oxide-semiconductor (MOS) transistor, the method comprising the steps of:

providing a semiconductor substrate;

forming a gate oxide layer, a polysilicon layer and a silicon nitride layer over the substrate;

patterning the gate oxide layer, the polysilicon layer and the silicon nitride layer to form a gate structure;

forming spacers over the sidewalls of the gate oxide layer, the polysilicon layer and the silicon nitride layer;

forming a dielectric layer over the substrate, the silicon nitride layer and the spacers;

planarizing the dielectric layer by removing a portion of the dielectric layer until a surface of the silicon nitride is exposed;

removing the silicon nitride layer to expose the polysilicon layer;

implanting ions into the polysilicon layer to lower its resistance;

forming a glue layer over the dielectric layer and the polysilicon layer; and forming a conductive layer over the glue layer.

2. The method of claim 1, wherein the step of forming the gate oxide layer includes depositing silicon dioxide.

3. The method of claim 1, wherein the step of forming the silicon nitride layer includes a low-pressure chemical vapor deposition method.

4. The method of claim 1, wherein the step of planarizing the dielectric layer includes a chemical-mechanical polishing method.

5. The method of claim 1, wherein the step of patterning the gate oxide layer, the polysilicon layer and the silicon nitride layer includes using a photolithographic and etching method.

6. The method of claim 1, wherein the step of removing the silicon nitride layer includes an etching back method.

7. The method of claim 1, wherein the step of forming the glue layer includes depositing titanium nitride.

8. The method of claim 1, wherein the step of forming the conductive layer includes a chemical vapor deposition method.

9. The method of claim 1, wherein the step of forming the conductive layer includes depositing tungsten.

10. The method of claim 1, wherein the step of forming the conductive layer includes depositing copper.

11. The method of claim 1, wherein the step of forming the conductive layer includes depositing silicon-aluminum alloy.

12. The method of claim 1, wherein the step of forming the conductive layer includes depositing titanium silicide.

* * * * *